United States Patent [19]

Madurawe

[11] Patent Number: 5,138,576
[45] Date of Patent: Aug. 11, 1992

[54] METHOD AND APPARATUS FOR ERASING AN ARRAY OF ELECTRICALLY ERASABLE EPROM CELLS

[75] Inventor: Raminda Madurawe, Santa Clara, Calif.

[73] Assignee: Altera Corporation, San Jose, Calif.

[21] Appl. No.: 788,606

[22] Filed: Nov. 6, 1991

[51] Int. Cl.[5] .................................. G11C 11/40
[52] U.S. Cl. .................... 365/125; 365/218; 357/23.5
[58] Field of Search .............. 365/185, 218, 201, 205; 357/23.5

[56] References Cited

U.S. PATENT DOCUMENTS

| | | | |
|---|---|---|---|
| 4,099,196 | 7/1978 | Simko | 357/23.5 |
| 4,334,292 | 6/1982 | Kotecha | 365/218 |
| 4,437,172 | 3/1984 | Masuoka | 365/185 |
| 4,437,174 | 3/1984 | Masuoka | 365/218 |
| 4,466,081 | 8/1984 | Masuoka | 365/218 |
| 4,479,203 | 10/1984 | Kuo | 357/23.5 |
| 4,531,203 | 7/1985 | Masuoka et al. | 365/185 |
| 4,803,529 | 2/1989 | Masuoka | 357/23.5 |
| 4,910,565 | 3/1990 | Masuoka | 357/23.5 |
| 4,924,437 | 5/1990 | Paterson et al. | 365/185 |
| 4,967,393 | 10/1990 | Yokoyama et al. | 365/185 |
| 4,979,146 | 12/1990 | Yokoyama et al. | 365/185 |
| 5,034,926 | 7/1991 | Taura et al. | 365/218 |
| 5,036,378 | 7/1991 | Lu et al. | 357/23.5 |
| 5,095,344 | 3/1992 | Harari | 357/23.5 |
| 5,095,461 | 3/1992 | Miyakawa et al. | 365/185 |

OTHER PUBLICATIONS

Lai, S., IEDM Short Course on Non-Volatile Memories, Flash Memories, San Francisco, Calif., Dec. 9, 1990.

*Primary Examiner*—Joseph E. Clawson, Jr.
*Attorney, Agent, or Firm*—Jeffrey H. Ingerman

[57] ABSTRACT

A method and apparatus for erasing an array of electrically erasable EPROM cells that avoids overerasure and allows programming or erasure of individual cells are provided. An erase line for each column of the array applies erase potential to the erase node of each cell in the column, provided that the erase node is connected to the erase line by a transistor controlled by a row select line. A sense amplifier determines when each cell begins to conduct and disconnects that cell from its erase line. By selecting a particular row, and then applying erase potential only to selected erase lines, a pattern of erased and programmed cells can be created in each row. The pattern differs from row to row depending on which erase lines have erase potential applied when that row is selected. Bias differences between erase and read modes assure that the erased cells, which have gone slightly into depletion, are not in depletion in normal operation.

11 Claims, 1 Drawing Sheet

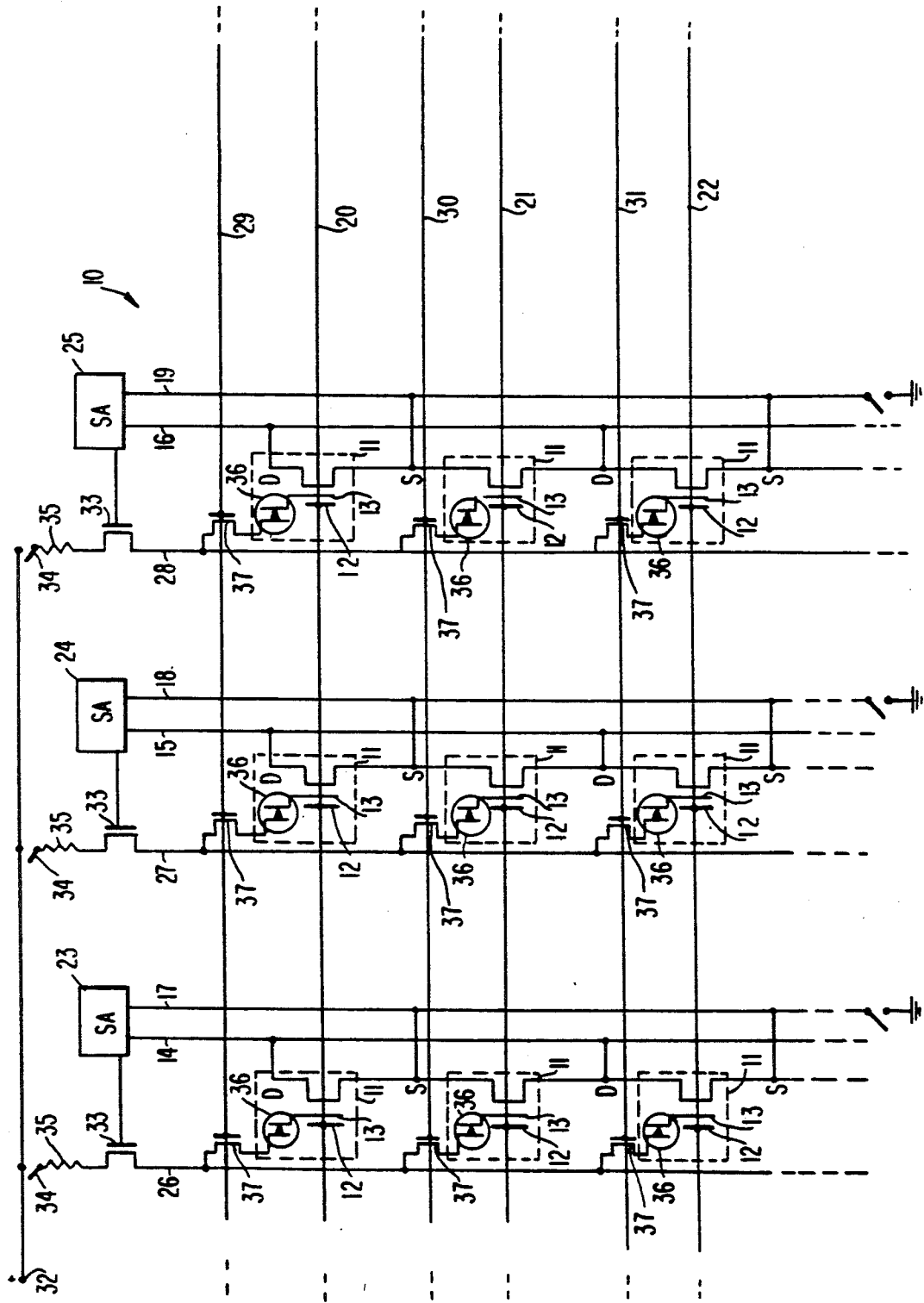

METHOD AND APPARATUS FOR ERASING AN ARRAY OF ELECTRICALLY ERASABLE EPROM CELLS

BACKGROUND OF THE INVENTION

This invention relates to arrays of electrically erasable EPROM cells, and particularly to techniques for erasing such arrays.

Erasable programmable read-only memory (EPROM) technology is well known for use in both memory and programmable logic applications. In particular, EPROMs are implemented using floating gate field effect transistors in which the binary states of the EPROM cell are represented by the presence or absence on the floating gate of sufficient charge to prevent conduction even when a normal high signal is applied to the gate of the EPROM transistor.

EPROMs are available in several varieties. In the traditional and most basic form, EPROMs are programmed electrically and erased by exposure to ultraviolet light. These EPROMs can be referred to as ultraviolet erasable programmable read-only memories ("UVEPROMs"). UVEPROMs are programmed by running a high current between the drain and the source of the UVEPROM transistor while applying a positive potential to the gate. The positive potential on the gate attracts energetic ("hot") electrons from the drain-to-source current, which jump onto the floating gate in an attempt to reach the gate and become trapped on the floating gate.

Another form of EPROM is the electrically erasable programmable read-only memory ("EEPROM" or "E$^2$PROM"). EEPROMs are programmed and erased electrically using a phenomenon known as Fowler-Nordheim tunneling.

Still another form of EPROM is "Flash EPROM," which is programmed using hot electrons like a traditional EPROM (UVEPROM) and electrically erased using Fowler-Nordheim tunneling like an EEPROM. Both Flash EPROM and EEPROM, which can be erased in a "flash" or bulk mode in which all cells in an array can be erased simultaneously using Fowler-Nordheim tunneling, and will be referred to hereinafter as "Flash cells" or "Flash devices."

UVEPROM and EEPROM have been used for both memory applications and programmable logic applications. To date, however, Flash devices have been used primarily for memory applications. One obstacle to using Flash devices is the phenomenon of overerasure. Overerasure is the result of continuing the Fowler-Nordheim erase process too long, so that too much charge is removed from the floating gate, with the result that the Flash device goes into depletion mode, in which it is always conducting (unless the gate-to-source voltage goes negative).

In a programmable logic device ("PLD") or memory chip in which there is an overerased Flash transistor, the leakage current resulting from the depletion mode operation of that transistor can interfere with accurate reading of the states of neighboring cells in the array. This can be cured by having in each cell a second "select" transistor, allowing the selection or deselection of a particular device for reading. Many Flash memory applications employ such select transistors. However, in logic applications, the use of such a transistor consumes chip area, and also affects array speed.

Another solution frequently employed with Flash EPROM devices is to use an "intelligent" erasing algorithm in which the device is repeatedly erased a small amount and then verified to see if the cell threshold has shifted the desired amount. However, such a technique can be time-consuming, and adds to programming complexity.

In copending, commonly-assigned U.S. patent application Ser. No. 07/788,607, filed concurrently herewith and hereby incorporated by reference in its entirety, a technique is disclosed for erasing entire columns or arrays of Flash devices simultaneously while preventing overerasure. That is accomplished by programming all devices in the column or array so that none of them conduct, and then connecting them to a high voltage erase supply through a high-impedance device. As the Flash devices erase, one will eventually begin to conduct. As soon as that happens, a current will flow through the conducting Flash device and the high-impedance device, dividing the high voltage supply so that the potential across the Flash devices is no longer high enough to support Fowler-Nordheim tunneling, and erasure of all Flash devices in the column or array stops. Erasure is therefore self-limiting. A drawback of that technique, however, is that erasure of all devices stops when the first device conducts. One must rely on a tight distribution of device characteristics among all the devices in the column or array to be sure that the remaining devices are also erased.

Accordingly, it would be desirable to be able to provide programming methods or apparatus for groups of Flash cells in which susceptibility to overerasure is reduced or eliminated, and in which erasure of each device in the group could be more readily assured.

SUMMARY OF THE INVENTION

It is an object of this invention to provide programming methods or apparatus for groups of Flash cells in which susceptibility to overerasure is reduced or eliminated, and in which erasure of each device in the group can be more readily assured.

In accordance with this invention, there is provided apparatus for erasing an array of Flash cells and for stopping erasure of each cell in the array of cells on onset of conduction by that cell, each of the cells having a gate, a source, a drain, a floating gate from which charge must be removed by placing a high potential difference thereacross to erase the cell, and an erase node for applying the high potential across the floating gate. The cells are connected in parallel columns, and the sources of all cells in each column are connected in common to a respective source line for the column and the drains of all cells in each column are connected in common to a respective drain line for the column. The cells are also arranged in parallel rows orthogonal to the columns, said gates of said cells in each one of said rows being connected to a respective gate line for that one of the rows. The apparatus comprises a supply of ground potential, means for applying ground potential to each of the source lines, means for applying ground potential to each of the gates, a supply of high positive potential. A plurality of column erase lines is provided, each associated with a respective column, for connecting the erase node of each cell in the respective column to the supply of high positive potential. A plurality of sense amplifier means is also provided, each associated with a respective column for sensing conduction between the drain line and the source line of the respective column. A plurality of switching means, each associated with a respective column, switchably connects each respective column erase line to the supply of high positive potential responsive to output of a respective one of the sense amplifier means, with the respective column erase line being connected to the supply of high positive potential in absence of conduction and being disconnected from the supply of high positive potential when there is conduction. A plurality of selecting means, each associated with one of the cells selectively connects the erase node of that one of the cells to the respective column erase line. A plurality of select lines, each associated with a respective row, actuates the selecting means of all cells in the respective row. When a row is selected by assertion of its respective select line, the high positive potential causes electrons to flow off the floating gates of each of the cells in the selected row whose respective switching means is switched to connect its respective column erase line to the supply of high positive potential. As enough electrons have been removed from the floating gate of each one of the selected cells in the selected row, that one the cells begins to conduct, the output of the sense amplifier associated with the column of that one of the cells changes, and the switching means disconnects the respective column erase line associated with that one of the cells from the supply of high positive potential. As a result, insufficient potential remains across the floating gate to remove additional electrons, whereby erasure of each cell in the selected row is stopped at onset of conduction by that cell.

A method of operating the apparatus is also provided.

BRIEF DESCRIPTION OF THE DRAWINGS

The above and other objects and advantages of the invention will be apparent upon consideration of the following detailed description, taken in conjunction with the accompanying FIGURE, which is a schematic diagram of an array of Flash devices in accordance with the present invention.

DETAILED DESCRIPTION OF THE INVENTION

Fowler-Nordheim tunneling occurs across thin oxides (less than about 110 Å) at potentials (e.g., 7-8 Mv/cm) above the normal operating potentials of most electronic devices. In EEPROM devices, oxides of such thickness are grown between the floating gate and the write/erase junction. In Flash EPROM devices such oxides may be grown between the floating gate and the erase/read junction, and other implementations are possible.

The FIGURE shows a three-by-three portion of an array 10 of Fowler-Nordheim erasable devices 11. Each device 11 has a gate 12, a floating gate 13, and a drain D and a source S. Each drain D is connected to a respective drain line (bit line) 14, 15, 16, while each source S is connected to a respective source line 17, 18, 19. Similarly, each gate 12 is connected to a respective gate line (word line) 20, 21, 22. A respective sense amplifier 23, 24, 25 of any conventional or other design is connected to each respective drain line/source line pair 14/17, 15/18, 16/19.

In accordance with the present invention, array 10 additionally includes a respective column erase line 26, 27, 28 associated with each column of devices 11, and a respective row select line 29, 30, 31 associated with each row of devices 11. Each erase line 26, 27, 28 is preferably switchably connected to a supply 32 of erase potential (preferably a relatively high voltage compared to normal logic levels—e.g., between about 13 volts and about 15 volts) through a controllable switching device such as transistor 33, which is controlled by sense amplifier 23, 24, 25, and a further switch 34, which, while illustrated as a simple switch, can be a controllable device such as a transistor. Optionally, device 33 is connected to supply 32 by pull-up impedance 35, which can be any suitable high-impedance device, such as a resistor or transistor or any of the other high-impedance devices discussed in said above-incorporated, concurrently filed copending application Ser. No. 07/788,607.

The erase potential on erase line 26, 27, 28 is applied to erase node 36 of each respective cell 11 through a respective transistor 37 which is controlled by respective row select line 29, 30, 31. Erase node 36 is shown as a tunnel capacitor connected to floating gate 13. If the EPROM device of cell 11 is an EEPROM, the tunnel capacitor is normally formed in the silicon wafer as part of the device. If the EPROM device is a Flash EPROM, the tunnel capacitor would be separately formed in the silicon wafer.

In operation, selected ones of cells 11 are erased by first programming all cells 11 in array 10. A row is then selected by asserting the appropriate row select line 29, 30, 31, connecting erase node 36 of each cell 11 in that row to its respective column erase line 26, 27, 28. Appropriate ones of switches 34 are then closed to connect to supply 32 the column erase line of any cell 11 in the selected row which is desired to be erased; for those cells 11 in the selected row that are to remain programmed, the corresponding switches 34 are not closed. At the same time, ground potential is applied to source lines 17, 18, 19 and to word lines 20, 21, 22.

For each cell 11 for which row select line 29, 30, 31 is asserted and switch 34 is closed, the application of erase potential to erase node 36 and ground potential to gate 12 and source S causes erasure of that cell 11 by Fowler-Nordheim tunneling. As the cell 11 becomes erase and begins to conduct at the edge of depletion mode, that conduction between drain line 14, 15, 16 and source line 17, 18, 19 is sensed by sense amplifier 23, 24, 25, which immediately cuts off the erase voltage from the corresponding erase line 26, 27, 28 by opening the corresponding switch 33. By asserting only one row select line 29, 30, 31 at a time, one can be assured that each cell 11 will be erased just to the point that its corresponding sense amplifier 23, 24, 25 senses that it conducts, preventing overerasure of that cell. However, erasure of other cells 11 in the selected row will continue until each individually begins to conduct. Therefore, it is not necessary that cells 11 have such a tight distribution of device characteristics as when multiple cells are being erased simultaneously and conduction by one cell stops erasure for all cells. At the same time, the selection of only one row at a time prevents the erase process from disturbing programmed cells in the same column (or other, already erased cells).

After all desired cells 11 in the selected row have been erased, a new row is selected and the desired ones of switches 34 are closed to erase desired ones of cells 11 in the newly selected row, which need not correspond to those in the previous row. In this way, individual cells 11 in array 10 can be programmed or erased as desired.

It is undesirable for a cell 11 to actually go into depletion mode as it is being erased, because that would clearly affect normal operations. During erase, positive coupling to the floating gate from the erase/read junction is greater than in the read mode. This will cause the cell to enter depletion mode sooner in the erase mode than in normal operations where a lower read voltage is applied to the erase/read node. The net result is a positive threshold when the cell is biased for read operation.

Normal operations can be more definitely assured by one of several alternative modes of operation. A positive voltage bias can be applied to the drain or source during erase or read, respectively. Applying the appropriate voltage in either case will provide sufficient margin from the depletion turn-on point. Margin is necessary to account for variations with ambient temperature and to account for internal ground bus voltage drop.

Thus it is seen that programming methods or apparatus for groups of Flash cells in which susceptibility to overerasure is reduced or eliminated, and in which erasure of each device in the group can be more readily assured, are provided. One skilled in the art will appreciate that the present invention can be practiced by other than the described embodiments, which are presented for purposes of illustration and not of limitation, and the present invention is limited only by the claims which follow.

What is claimed is:

1. Apparatus for erasing an array of Flash cells and for stopping erasure of each cell in said array of cells on onset of conduction by said cell, each of said cells having a gate, a source, a drain, a floating gate from which charge must be removed by placing a high potential difference thereacross to erase the cell, and an erase node for applying said high potential across said floating gate, said cells connected in parallel columns, the sources of all cells in each said column being connected in common to a respective source line for said column and the drains of all cells in each said column being connected in common to a respective drain line for said column, said cells also arranged in parallel rows orthogonal to said columns, said gates of said cells in each one of said rows being connected to a respective gate line for said one of said rows, said apparatus comprising:

a supply of ground potential;

means for applying ground potential to each of said source lines;

means for applying ground potential to each of said gates;

a supply of high positive potential;

a plurality of column erase lines, each associated with a respective column, for connecting the erase node of each cell in said respective column to said supply of high positive potential;

a plurality of sense amplifier means, each associated with a respective column for sensing conduction between the drain line and the source line of said respective column;

a plurality of switching means, each associated with a respective column, for switchably connecting each respective column erase line to said supply of high positive potential responsive to output of a respective one of said sense amplifier means, said respective column erase line being connected to said supply of high positive potential in absence of conduction and being disconnected from said supply of high positive potential when there is conduction;

a plurality of selecting means, each associated with one of said cells for selectively connecting the erase node of said one of said cells to said respective column erase line; and a plurality of select lines, each associated with a respective row for actuating said selecting means of all cells in said respective row; wherein:

when a row is selected by assertion of its respective select line, said high positive potential causes electrons to flow off said floating gates of each of said cells in said selected row whose respective switching means is switched to connect its respective column erase line to said supply of high positive potential, such that as enough electrons have been removed from said floating gate of each one of said cells in said selected row:

said one of said cells begins to conduct, said output of said sense amplifier associated with the column of said one of said cells changes, and said switching means disconnects the respective column erase line associated with said one of said cells from said supply of high positive potential, insufficient potential remaining across said floating gate to remove additional electrons, whereby erasure of each cell in said selected row is stopped at onset of conduction by said cell.

2. The apparatus of claim 1 further comprising means for controllably connecting each respective column erase line to said supply of high positive potential, whereby only desired ones of said cells in said selected row may be erased.

3. The apparatus of claim 1 wherein said erase node comprises a tunnel capacitor.

4. The apparatus of claim 1 wherein said switching means comprises a transistor.

5. The apparatus of claim 4 wherein said transistor is a field effect transistor.

6. The apparatus of claim 1 wherein said selecting means comprises a transistor.

7. The apparatus of claim 6 wherein said transistor is a field effect transistor.

8. The apparatus of claim 1 wherein said Flash cell comprises an EEPROM.

9. The apparatus of claim 1 wherein said Flash cell comprises a Flash EPROM.

10. A method of erasing an array of Flash cells and for stopping erasure of each cell in said array of cells on onset of conduction by said cell, each of said cells having a gate, a source, a drain, a floating gate from which charge must be removed by placing a high potential difference thereacross to erase the cell, and an erase node for applying said high potential across said floating gate, said cells connected in parallel columns, the sources of all cells in each said column being connected in common to a respective source line for said column and the drains of all cells in each said column being connected in common to a respective drain line for said column, said cells also arranged in parallel rows orthogonal to said columns, said gates of said cells in each one of said rows being connected to a respective gate line for said one of said rows, said apparatus comprising:

applying ground potential to each of said source lines;

applying ground potential to each of said gates;

providing a plurality of column erase lines, each associated with a respective column, for connecting the erase node of each cell in said respective column to said supply of high positive potential;

switchably connecting each respective column erase line to said supply of high positive potential responsive to the conduction state of the respective drain and source lines, said respective column erase line being connected to said supply of high positive potential in absence of conduction and being disconnected from said supply of high positive potential when there is conduction;

selectively connecting the erase nodes of cells in a selected row to their respective column erase lines; and sensing the conduction state of said drain and source lines; wherein:

when a row and columns are selected, said high positive potential causes electrons to flow off said floating gates of each of said cells in a selected row and a selected column, such that as enough electrons have been removed from said floating gate of each one of said cells in said row:

said one of said cells begins to conduct, and said conduction is sensed and the respective column erase line is disconnected from said cell, in sufficient potential remaining across said floating gate to remove additional electrons, whereby erasure of each cell in said selected row is stopped at onset of conduction by said cells.

11. The method of claim 10 further comprising controllably connecting each respective column erase line to said supply of high positive potential, whereby only desired ones of said cells in said selected row may be erased.

* * * * *